United States Patent [19]

Tsuji

[11] Patent Number: 5,212,117
[45] Date of Patent: May 18, 1993

[54] METHOD OF MANUFACTURING A SEMICONDUCTOR DEVICE CONTACT STRUCTURE USING LIFT

[75] Inventor: Hitoshi Tsuji, Yokohama, Japan

[73] Assignee: Kabushiki Kaisha Toshiba, Kawasaki, Japan

[21] Appl. No.: 835,116

[22] Filed: Feb. 14, 1992

Related U.S. Application Data

[63] Continuation of Ser. No. 601,390, Oct. 23, 1990, abandoned.

[30] Foreign Application Priority Data

Oct. 24, 1989 [JP] Japan ................ 1-274971

[51] Int. Cl.$^5$ ................................ H01L 21/31
[52] U.S. Cl. ........................ 437/229; 437/238; 437/241; 437/944; 148/DIG. 100
[58] Field of Search ........... 437/944, 229, 241, 238; 148/DIG. 100

[56] References Cited

U.S. PATENT DOCUMENTS

| | | | |
|---|---|---|---|
| 4,224,361 | 9/1980 | Romankiw | 437/229 |
| 4,546,534 | 10/1985 | Nicholas | 437/229 |
| 4,576,678 | 3/1986 | Shibata | 437/228 |
| 4,599,137 | 7/1986 | Akiya | 156/643 |
| 4,859,618 | 8/1989 | Shikata | 437/41 |

FOREIGN PATENT DOCUMENTS

| | | | |
|---|---|---|---|
| 0005741 | 5/1979 | European Pat. Off. . | |
| 0211353 | 7/1986 | European Pat. Off. . | |
| 58-077247 | 5/1983 | Japan . | |
| 63-104336 | 5/1988 | Japan | 437/944 |
| 2024504 | 1/1980 | United Kingdom . | |

OTHER PUBLICATIONS

N Kato et al., 8093 IEEE Transactions on Electron Devices, vol. ED-30 (1983) Jun., No. 6 pp. 663-668.
Abdel-Motaleb et al., 205 Solid State Electronics, vol. 30 No. 4, Apr. 1987, pp. 361-363.
Brad D. Cantos et al, SPIE (The Society of Photo-Optical Instrumentation Engineers), vol. 773, pp. 61-67 (1987).
A. Bhattacharyya et al, "Lift-Off Insulator Process", IBM Technical Disclosure Bulletin, vol. 21, No. 9, Feb. 1979. pp. 3577-3578.

Primary Examiner—Brian E. Hearn
Assistant Examiner—Laura M. Holtzman
Attorney, Agent, or Firm—Finnegan, Henderson, Farabow, Garrett & Dunner

[57] ABSTRACT

A method of manufacturing a semiconductor device comprising the steps of forming a first insulating layer on a semiconductor substrate, forming a resist film sensitive to electron beams on the first insulating layer, applying electron beams onto a predetermined region of the resist film, removing unnecessary portions of the resist film by using a developer, thereby forming a remaining pattern resist film, forming a second insulating layer on the entire region of the first insulating layer and the remaining pattern resist film, simultaneously removing the remaining pattern resist film and the second insulating layer which is formed thereon, thereby forming an opening of a predetermined pattern on the second insulating layer, and etching the first insulating layer through the opening, using the second insulation layer as a mask, thereby causing a predetermined region of the semiconductor substrate to be exposed.

16 Claims, 2 Drawing Sheets

F I G. 1
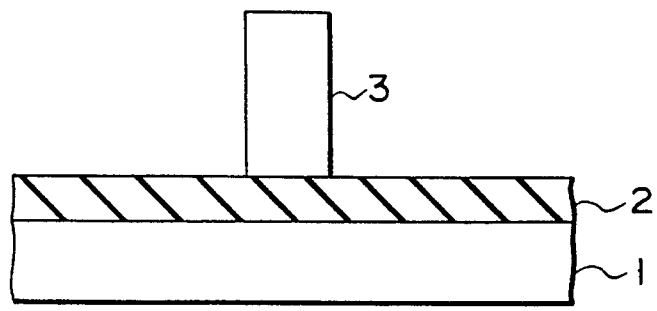
F I G. 2
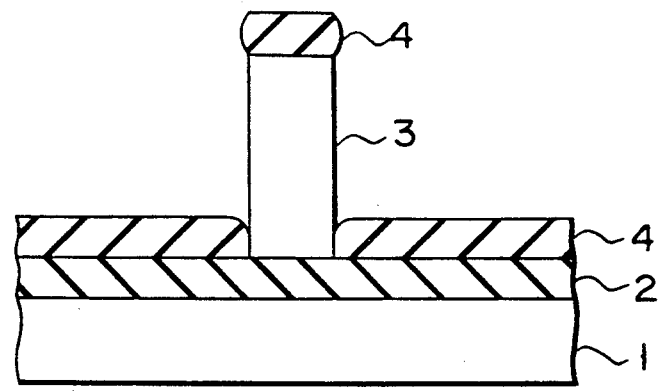
F I G. 3

METHOD OF MANUFACTURING A SEMICONDUCTOR DEVICE CONTACT STRUCTURE USING LIFT

This application is a continuation of application Ser. No. 07/601,390, filed Oct. 23, 1990, now abandoned.

BACKGROUND OF THE INVENTION

1. Field of the Invention

This invention relates to a method of manufacturing a semiconductor device, which is applied to form a minute opening pattern (extraction pattern) having a diameter of 0.2 μm or less.

2. Description of the Related Art

EB (electron beam) drawing is widely employed as a method for forming a minute opening pattern with a diameter of 0.2 μm or less in an insulating layer and the like for constituting a semiconductor device. In EB drawing, to obtain a minute extraction pattern, an insulating layer and the like are patterned using, in particular, a positive resist consisting of PMMA (polymethylmethacrylate) having high resolution.

A multilayer resist process using a plurality of resist layers, or a method using an image-reversal process and a multilayer resist process are used to form a minute opening pattern. For example, SPIE (The Society of Photo-Optical Instrumentation Engineers), Vol. 773 (1987), pages 61 to 67 discloses a method using an image-reversal process and a multilayer resist process.

When an opening pattern is formed by using a high-resolution resist such as PMMA, since the quality of the resist have been improved and a thin resist film can be formed, high definition of a level of 0.1 μm to 0.05 μm is obtained. However, PMMA is not very much resistant to RIE (reactive ion etching) or heat. Hence, process conditions are strictly limited in the step of etching during transcription.

Moreover, since the resist consisting of PMMA and the like is not highly sensitive to light, a long period of time is required for drawing, and development conditions are also limited in detail. Hence, the throughput in manufacturing semiconductor devices by means of this method is low.

Further, the multilayer resist process requires a larger number of manufacturing steps than a single layer resist process. In addition, although the dimensions of the top resist layer can be measured, the dimensions and configuration of lower resist layers cannot be measured unless the cross section is checked. The dimensions of the opening pattern can be measured by an SEM (scanning-type electronic microscope); however, to measure the dimensions of the cross section precisely, wafers must be broken in the PMMA resist process and in the multilayer resist process.

When the dimensions of an opening pattern are measured by using an SEM without breaking wafers, definition of a level of only 0.2 μm is obtainable in a conventional device, and the resist on the periphery of the opening is charged up during measurement, so that the dimensions cannot be measured.

SUMMARY OF THE INVENTION

It is an object of the present invention to provide a method of manufacturing a semiconductor device in which the dimensions of the resist pattern can be measured easily and accurately, and the pattern can be drawn in a short time.

The method of manufacturing a semiconductor device of the present invention comprises the steps of: forming a first insulating layer on a semiconductor substrate; forming a resist film sensitive to electron beams on the first insulating layer; applying electron beams onto a predetermined region of the resist film; removing unnecessary portions of the resist film by using a developer, thereby forming a remaining pattern resist film; forming a second insulating layer on the entire region of the first insulating layer and the remaining pattern resist film; simultaneously removing the remaining pattern resist film and the corresponding portion of the second insulating layer formed thereon, thereby forming an opening of a predetermined pattern in the second insulating layer; and etching the first insulating layer through the opening, using the second insulation layer as a mask, thereby exposing a predetermined region of the semiconductor substrate.

According to the method of the invention, a first insulating layer is formed on a semiconductor substrate, and a remaining pattern made of a negative resist is formed on the first insulating layer. A second insulating layer is formed on the entire region of the first insulating layer and on the remaining pattern. Thereafter, the negative resist is removed, forming an opening pattern in the second insulating layer. The first insulating layer is etched using the opening pattern formed on the second insulating layer as a mask, thereby forming an opening pattern in the first insulating layer.

Since a remaining resist pattern is formed on the substrate, the dimensions of the opening pattern can be measured by measuring the dimensions of the remaining pattern. In addition, since the remaining pattern is made of a negative resist, the resist is hardly damaged even when measurement is performed by an SEM. As a result, the dimensions of the opening pattern can be measured accurately. Further, since a negative resist is used, pattern drawing requires only a short period of time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 5 show in sequence the steps of manufacturing a semiconductor device according to an embodiment of the present invention.

DETAILED DESCRIPTION OF THE PREFERRED EMBODIMENTS

Figure 4:
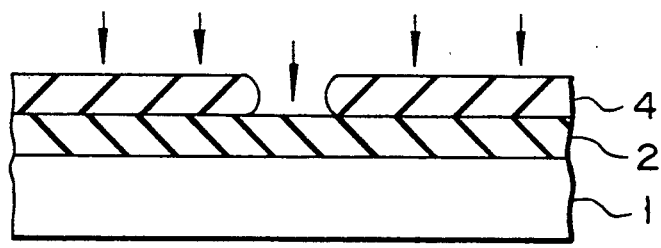

Embodiments of the present invention will be described below with reference to accompanying drawings.

Embodiment 1

In FIG. 1, a substrate 1 is made of GaAs, or is constituted by a GaAs layer and an epitaxial layer of Al-GaAs formed thereon. A first insulating layer 2 made of, for example, $Si_3N_4$ is deposited to 500~1000 Å thickness on the GaAs substrate 1 since, if the first insulating layer 2 is thinner than 500 Å, it does not fulfill the function of protecting the surface of the GaAs substrate 1 from contamination and if it is thicker than 1000 Å, a pattern conversion error in etching (to be described later) is large, and a long etching time is required.

Next, a negative resist film 3 made of, for example, a novolak resin (SAL601, Shipley Corporation) which is sensitive to electron beams is formed 0.5 μm thick on the first insulating layer 2. Then, a predetermined pattern is drawn on the resist film 3 by an EB exposure device. The pattern is the inversion of the pattern to be ultimately formed on the resist film 3.

Next, as shown in FIG. 2, a 0.1 μm wide remaining pattern of the resist film 3 is formed by developing treatment, and subjected to post-baking.

Subsequently, as shown in FIG. 3, a second insulating layer 4 made of, for example, $SiO_2$ is deposited to a thickness of 500~1000 Å over the entire first insulating layer 2 and the resist film 3 by sputtering, which enables deposition at a low temperature. If the second insulating layer 4 is thinner than 500 Å, it does not satisfactorily function as a mask, since the selection rate in an etching process (to be described later) cannot be set at a suitable value, and if the second insulating layer 4 is thicker than 1000 Å, it is difficult to lift off the layer 4 and the resist film 3 together (to be described later). In consideration of this, it is desirable that the resist film 3 be six to seven times thicker than the second insulating layer 4.

Thereafter, as shown in FIG. 4, the remaining pattern of the resist film 3 and the second insulating film 4 formed thereon are removed by acetone or an ordinary resist lift-off solution.

Figure 5:
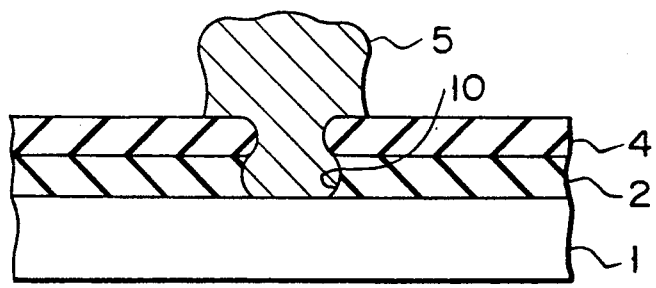

Next, as shown in FIG. 5, CDE (chemical dry etching) is performed with $CF_4+O_2$ gas using the second insulating layer 4 as a mask, thereby forming an opening pattern 10 in the first insulating layer 2 ($Si_3N_4$). Thereafter, electrode metal 5 is formed on the second insulating layer 4, such that it is brought into contact with a predetermined region of the GaAs substrate 1 via opening pattern 10. Thus, a gate electrode for use in a GaAs . FET, an HEMT, or the like is formed.

Embodiment 2

In this embodiment also, a gate electrode for use in a GaAs FET, an HEMT, or the like is formed in the same manner as in embodiment 1 through the steps shown in FIGS. 1 to 5, except that the first insulating layer 2 and the second insulating layer 4 are respectively made of $SiO_2$ and $Si_3N_4$, and the first insulating layer 2 is removed by means of an RIE method.

First, as shown in FIG. 2, a negative resist film 3 is formed on a first insulating layer 2, and a 0.1 μm wide remaining pattern of the resist film 3 is formed.

Next, as shown in FIG. 3, a second insulating layer 4 made of $Si_3N_4$ is deposited to a thickness of 500~1000 Å over the entire first insulating layer 2 and the resist film 3 by means of sputtering.

Then, as shown in FIG. 4, the remaining pattern of the resist film 3 and the second insulating film 4 formed thereon are removed by acetone or an ordinary resist lift-off solution.

Next, as shown in FIG. 5, the first insulating layer 2 is dry-etched by an RIE method using $CF_4+O_2$ gas, thereby forming a 0.1 μm wide opening pattern 10 in the first insulating layer 2. Thereafter, electrode metal 5 is formed on the second insulating layer 4, such that it is brought into contact with a predetermined region of the GaAs substrate 1 via opening pattern 10. Thus, a gate electrode for use in a GaAs . FET, an HEMT, or the like is formed.

The opening pattern 10 of 0.1 μm width is formed by the electron beams under the condition of an acceleration voltage of 50 KeV. In this case, when the dosage is 0.4 nc/cm, a vertical profile is obtained.

According to the above embodiments 1 and 2, the dimensions of the negative resist film 3 were measured by means of end measuring SEM photography and cross-section measuring SEM photography, and errors were only 0.005~0.01 μm with a magnification of about 50,000.

Further, since a remaining pattern of the resist film 3 is formed, it is possible to check whether the side surfaces of the resist are tapered or vertical, and to measure the dimensions of the resist film 3 more easily than in the conventional method.

Moreover, since the resist film 3 is a negative film, the drawing time can be reduced to ⅛~1/5 of that required where a positive resist film having a low sensitivity is used.

Further, in the conventional method using a positive resist, an electrode metal is formed by a lift-off method immediately after etching is performed using $SiO_2$ as a resist mask, and then the resist removing and cleaning are performed. For this reason, the electrode may be seriously damaged and contaminated. In contrast, according to the above embodiments 1 and 2, since an electrode is formed after patterning, organic substances such as a resist rarely remain on the electrode or adversely affects it.

In the above embodiments 1 and 2, a GaAs substrate is used as a semiconductor substrate; however, a silicon substrate or the like may be used instead.

In addition, the first and second insulating layers 2 and 4 may be made of the same material.

Needless to say, various modifications may be made within the spirit of the invention.

As has been described above, since a remaining resist pattern is formed on the substrate, the dimensions of the opening pattern can be measured easily by measuring the dimensions of the remaining pattern. In addition, since the remaining pattern is made of a negative resist, the drawing time is short and the resist is hardly damaged even when measurement is performed by an SEM.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept a defined by the appended claims and their equivalents.

What is claimed is:

1. A method of manufacturing a contact structure in a semiconductor device utilizing lift-off for forming a submicron opening, comprising the steps of:
   forming an $Si_3N_4$ layer on a semiconductor substrate;
   forming a negative resist layer sensitive to electron beams on said $Si_3N_4$ layer;
   applying electron beams onto a predetermined region of said negative resist layer to draw a pattern thereon corresponding to said submicron opening to be formed;
   removing unnecessary portions of said negative resist layer by using a developer, thereby forming on a position where said submicron opening is to be formed a remaining pattern resist layer which consists of one layer and has a constant width substantially the same as that of said submicron opening, forming an $SiO_2$ layer on the entire region of said $Si_3N_4$ layer and said remaining pattern resist layer, said $SiO_2$ layer being formed by sputtering such that said remaining pattern resist layer has a thickness five to ten times larger than that of said $SiO_2$ layer;

simultaneously removing said remaining pattern resist layer and that part of said $SiO_2$ layer which is formed thereon, thereby forming said submicron opening in said $SiO_2$ layer;

dry-etching said $Si_3N_4$ layer through said submicron opening, using said $SiO_2$ layer as a mask, so as to expose that region of said semiconductor substrate which corresponds to said submicron opening; and forming a metal electrode in said submicron opening and on said $SiO_2$ layer such that it is brought into contact with said exposed region of said semiconductor substrate.

2. The method according to claim 1, wherein said step of dry-etching said $Si_3N_4$ is carried out by means of a chemical dry etching method.

3. The method according to claim 2, wherein said chemical dry etching method is carried out by using $CF_4+O_2$ gas.

4. The method according to claim 1, wherein said semiconductor substrate is made of GaAs.

5. The method according to claim 1, wherein said $SiO_2$ layer has a thickness of 500 to 1000 Å.

6. The method according to claim 5, wherein said negative pattern resist layer has a thickness of about 0.5 $\mu$m.

7. The method according to claim 6, wherein said $Si_3N_4$ layer has a thickness of 500 to 1000 Å.

8. The method according to claim 3, wherein said submicron opening has a diameter of 0.2 $\mu$m or less.

9. A method of manufacturing a contact structure in a semiconductor device utilizing lift-off for forming a submicron opening, comprising the steps of:

forming an $SiO_2$ layer on a semiconductor substrate;

forming a negative resist layer sensitive to electron beams on said $SiO_2$ layer;

applying electron beams onto a predetermined region of said negative resist layer to draw a pattern thereon corresponding to said submicron opening to be formed;

removing unnecessary portions of said negative resist layer by using a developer, thereby forming on a position where said submicron opening is to be formed a remaining pattern resist layer which consists of one layer and has a constant width substantially the same as that of said submicron opening;

forming an $Si_3N_4$ layer on the entire region of said $SiO_2$ layer and said remaining pattern resist layer, said $Si_3N_4$ layer being formed by sputtering such that said remaining pattern resist layer has a thickness five to ten times larger than that of said $Si_3N_4$ layer;

simultaneously removing said remaining pattern resist layer and that part of said $Si_3N_4$ layer which is formed thereon, thereby forming said submicron opening in said $Si_3N_4$ layer;

dry-etching said $SiO_2$ layer through said submicron opening using said $Si_3N_4$ layer as a mask, so as to expose that region of said semiconductor substrate which corresponds to said submicron opening; and forming a metal electrode in said submicron opening and on said $Si_3N_4$ layer such that it is brought into contact with said exposed region of said semiconductor substrate.

10. The method according to claim 9, wherein said step of dry-etching said $SiO_2$ is carried out by means of an RIE method.

11. The method according to claim 10, wherein said RIE method is carried out by using $CF_4+H_2$ gas.

12. The method according to claim 11, wherein said submicron opening has a diameter of 0.2 $\mu$m or less.

13. The method according to claim 12, wherein said $Si_3N_4$ layer has a thickness of 500 to 1000 Å.

14. The method according to claim 13, wherein said negative pattern resist layer has a thickness of about 0.5 $\mu$m.

15. The method according to claim 14, wherein said $SiO_2$ layer has a thickness of 500 to 1000 Å.

16. The method according to claim 15, wherein said semiconductor substrate is made of GaAs.

* * * * *